(12) United States Patent
Furutani

(10) Patent No.: US 12,302,493 B2
(45) Date of Patent: *May 13, 2025

(54) WIRING SUBSTRATE

(71) Applicant: IBIDEN CO., LTD., Gifu (JP)

(72) Inventor: Toshiki Furutani, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 206 days.

This patent is subject to a terminal disclaimer.

(21) Appl. No.: 18/050,573

(22) Filed: Oct. 28, 2022

(65) Prior Publication Data

US 2023/0144361 A1 May 11, 2023

(30) Foreign Application Priority Data

Nov. 5, 2021 (JP) ................. 2021-181194

(51) Int. Cl.
| | |
|---|---|
| *H05K 1/11* | (2006.01) |
| *H05K 1/02* | (2006.01) |
| *H05K 1/14* | (2006.01) |
| *H05K 1/18* | (2006.01) |
| *H05K 3/10* | (2006.01) |

(52) U.S. Cl.
CPC ........... *H05K 1/113* (2013.01); *H05K 1/0298* (2013.01); *H05K 1/14* (2013.01); *H05K 3/107* (2013.01);
(Continued)

(58) Field of Classification Search
CPC ...... H05K 1/113; H05K 1/0298; H05K 3/107; H05K 2201/096; H05K 3/4694;
(Continued)

(56) References Cited

U.S. PATENT DOCUMENTS

| | | | |
|---|---|---|---|
| 8,143,531 B2 * | 3/2012 | Miki ................. | H01L 23/49822 |
| | | | 174/262 |
| 2009/0290318 A1* | 11/2009 | Takahashi ............ | H05K 3/4694 |
| | | | 174/262 |

(Continued)

FOREIGN PATENT DOCUMENTS

| | | |
|---|---|---|
| CN | 103731982 A | 4/2014 |
| CN | 113270322 A | 8/2021 |

(Continued)

OTHER PUBLICATIONS

Co-penidng U.S. Appl. No. 18/050,636 (publicaiton # 2023/0145004), filed Oct. 28, 2022 (allowed claims).*

(Continued)

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes a first insulating layer, a conductor layer including first and second conductor pads, a second insulating layer having an opening exposing the second conductor pads, and a wiring structure including a resin insulating layer and a wiring layer and formed in the opening of the second insulating layer. The wiring structure has first surface side connection pads, second surface side connection pads and electrically connected to the second conductor pads of the conductor layer, and conductors that electrically connect the first surface side connection pads and the second surface side connection pads, the first surface side connection pads form a component mounting surface having first and second component mounting region, and the first surface side connection pads include a group of pads in the first region and a group of pads in the second region electrically connected to the group of pads in the first region.

20 Claims, 14 Drawing Sheets

(52) U.S. Cl.
CPC .............. *H05K 1/0271* (2013.01); *H05K 1/11* (2013.01); *H05K 1/181* (2013.01); *H05K 2201/096* (2013.01)

(58) Field of Classification Search
CPC ...... H05K 3/4644; H05K 3/4682; H05K 1/11; H05K 1/0271; H05K 3/4608; H05K 3/4614
See application file for complete search history.

(56) References Cited

U.S. PATENT DOCUMENTS

| | | | |
|---|---|---|---|
| 2016/0302308 A1* | 10/2016 | Lee | H01L 23/5385 |
| 2018/0139844 A1 | 5/2018 | You | |
| 2022/0367558 A1 | 11/2022 | Fujii et al. | |

FOREIGN PATENT DOCUMENTS

| | | | |
|---|---|---|---|
| JP | 2014-082334 A | 5/2014 |
| TW | 200731893 A | 8/2007 |
| TW | 202118029 A | 5/2021 |

OTHER PUBLICATIONS

Search Report issued Oct. 11, 2023 in corresponding Taiwan Patent Application No. 111141772, filed Nov. 2, 2022 (English-language Translation only), 1 page.

Office Action issued Dec. 24, 2024 in corresponding Chinese Patent Application No. 202211359973.5 (with machine English translation), 14 pages.

* cited by examiner

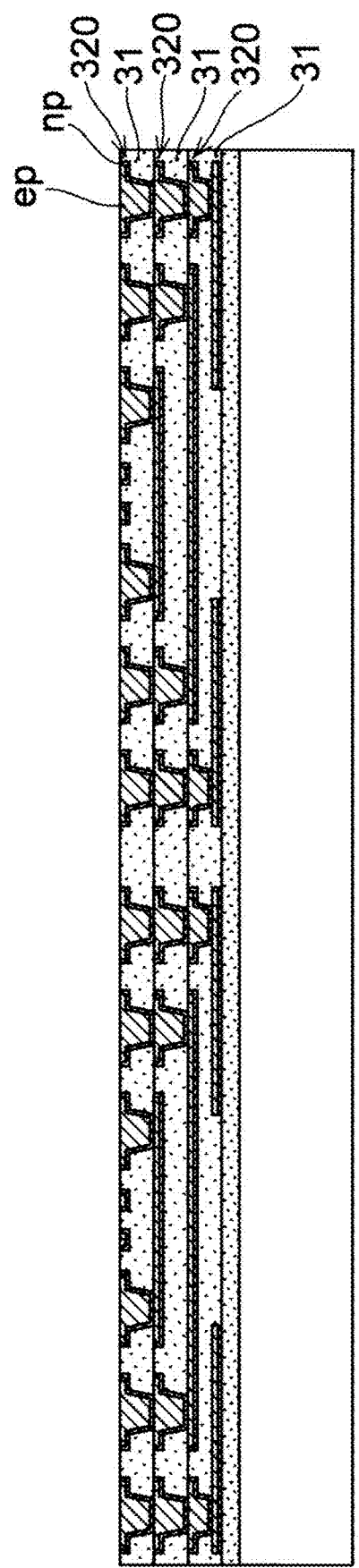

WIRING SUBSTRATE

CROSS-REFERENCE TO RELATED APPLICATIONS

The present application is based upon and claims the benefit of priority to Japanese Patent Application No. 2021-181194, filed Nov. 5, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-82334 describes a wiring board in which a wiring structure is formed in an opening provided in a solder resist layer. The entire contents of this publication are incorporated herein by reference.

SUMMARY OF THE INVENTION

According to one aspect of the present invention, a wiring substrate includes a first insulating layer, a conductor layer formed on the first insulating layer and including first conductor pads and second conductor pads, a second insulating layer formed on the conductor layer and having at least one opening exposing the second conductor pads, and a wiring structure including a resin insulating layer and a wiring layer and formed such that the wiring structure is formed in the at least one opening of the second insulating layer. The wiring structure has first surface side connection pads formed on a first surface, second surface side connection pads formed on a second surface on the opposite side with respect to the first surface and electrically connected to the second conductor pads of the conductor layer, and conductors that electrically connect the first surface side connection pads and the second surface side connection pads, the wiring structure is formed such that the first surface side connection pads form a component mounting surface having component mounting regions including a first component mounting region and a second component mounting region adjacent to the first component mounting region, and the first surface side connection pads in the wiring structure include a group of first surface side connection pads in the first component mounting region and a group of first surface side connection pads in the second component mounting region electrically connected to the group of first surface side connection pads in the first component mounting region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4D is a cross-sectional view illustrating a method for manufacturing a wiring substrate according to an embodiment of the present invention;

DETAILED DESCRIPTION OF THE EMBODIMENTS

Figure 1:
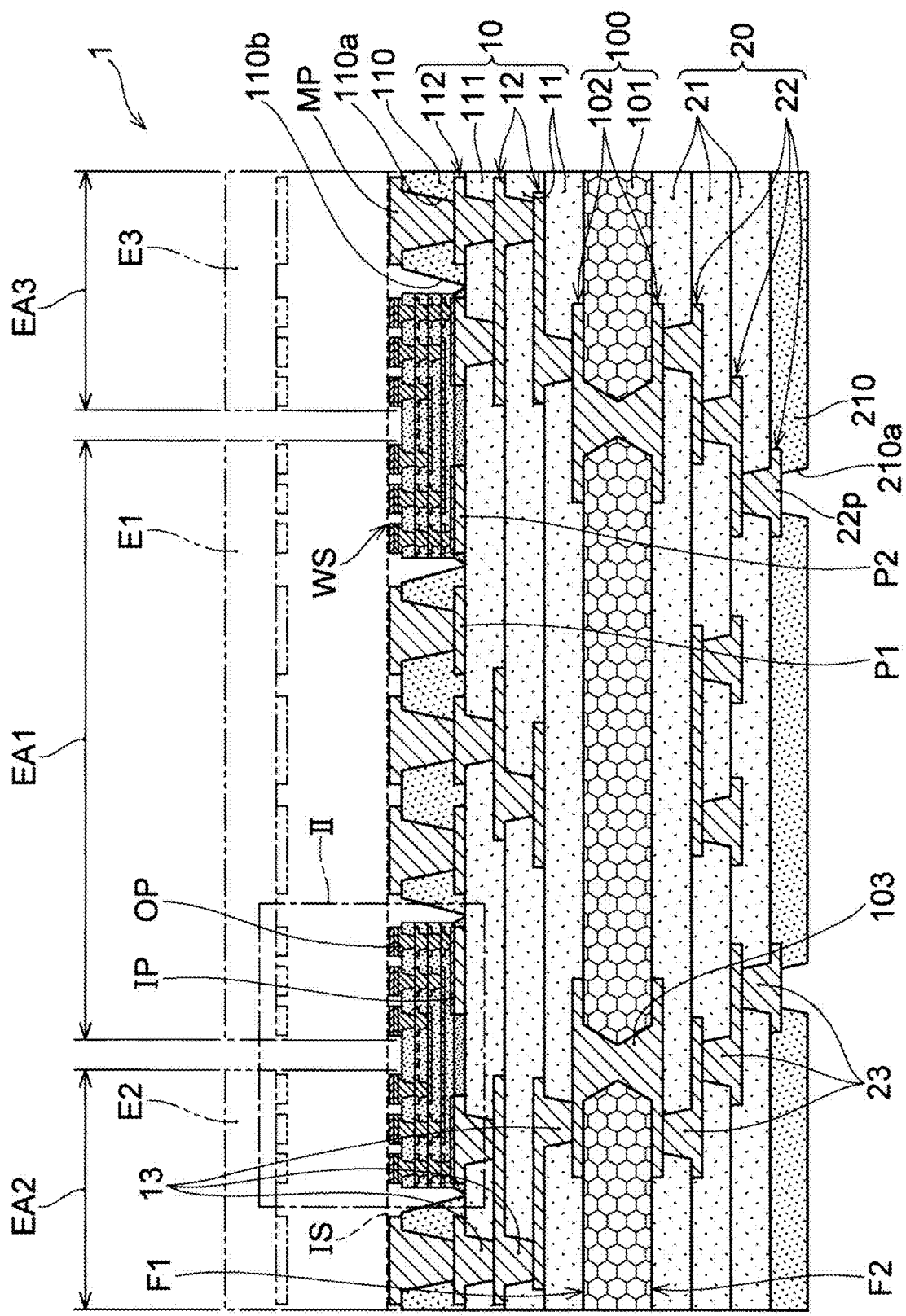
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

FIG. 1 illustrates a cross-sectional view of a wiring substrate 1 as an example of a structure for a wiring substrate according to an embodiment of the present invention.

As illustrated in FIG. 1, the wiring substrate 1 includes a core substrate 100 that includes an insulating layer (core insulating layer) 101 and conductor layers (core conductor layers) 102 that are respectively formed on both sides of the core insulating layer 101. On each of both sides of the core substrate 100, insulating layers and conductor layers are alternately laminated. In the illustrated example, a first build-up part 10 in which insulating layers (11, 111) and conductor layers (12, 112) are laminated is formed on a surface (F1) on one side of the core substrate 100. Further, a second build-up part 20 in which insulating layers 21 and conductor layers 22 are laminated is formed on a surface (F2) on the other side of the core substrate 100.

In the description of the wiring substrate of the present embodiment, a side farther from the core insulating layer 101 is referred to as "upper," "upper side," "outer side," or "outer," and a side closer to the core insulating layer 101 is referred to as "lower," "lower side," "inner side," or "inner." Further, for each of the structural components, a surface facing the opposite side with respect to the core substrate 100 is also referred to as an "upper surface," and a surface facing the core substrate 100 side is also referred to as a "lower surface." Therefore, in the description of each of the elements of the wiring substrate 1, a side farther from the core substrate 100 is also referred to as an "upper side," "upper-layer side," or "outer side," or simply "upper" or "outer," and a side closer to the core substrate 100 is also referred to as a "lower side," "lower-layer side," or "inner side," or simply "lower" or "inner."

Among the insulating layers of the first build-up part 10, the outermost insulating layer 111 is also referred to as the first insulating layer 111. Further, among the conductor layers of the first build-up part 10, the outermost conductor layer 112 is also referred to as the first conductor layer 112. On the first build-up part 10, a second insulating layer 110 is formed covering the first conductor layer 112 and the first insulating layer 111 exposed from conductor patterns of the first conductor layer 112. A third insulating layer 210 is formed on the second build-up part 20. The second insulating layer 110 and the third insulating layer 210 can be, for example, solder resist layers forming the outermost insulating layers of the wiring substrate 1.

Openings (110a, 110b) are formed in the second insulating layer 110. The openings (110a, 110b) are through holes penetrating the second insulating layer 110 in a thickness direction. The openings (110a) are filled with conductors. Wiring structures (WS) are respectively positioned in the openings (110b). The conductors filling the openings (110a) form an outermost surface of the wiring substrate 1 and form metal posts (MP) that can be used to connect the wiring substrate 1 to an external electronic component. Similar to the metal posts (MP), upper surfaces of the wiring structures (WS) positioned in the openings (110b) form the outermost surface of the wiring substrate 1 and have connection pads (OP) that can be used to connect the wiring substrate 1 to an external electronic component. Openings (210a) are formed in the insulating layer 210, and conductor pads (22p) of the outermost conductor layer 22 in the second build-up part 20 are exposed from the openings (210a).

The insulating layers (101, 11, 111, 21) of the wiring substrate 1 can each be formed, for example, using an insulating resin such as an epoxy resin, a bismaleimide triazine resin (BT resin) or a phenol resin. The insulating layers (101, 11, 111, 21) may each contain a reinforcing material (core material) such as a glass fiber and/or an inorganic filler such as silica or alumina. The second insulating layer 110 and the third insulating layer 210, which are solder resist layers, can each be formed using, for example, a photosensitive epoxy resin or polyimide resin, or the like.

In the insulating layer 101 of the core substrate 100, through-hole conductors 103 are formed connecting the conductor layer 102 that forms the surface (F1) on the one side of the core substrate 100 and the conductor layer 102 that forms the surface (F2) on the other side of the core substrate 100. In the insulating layers (11, 111, 21), via conductors (13, 23) connecting the conductor layers sandwiching the insulating layers (11, 111, 21) are formed.

The conductor layers (102, 12, 112, 22), the via conductors (13, 23), the through-hole conductors 103, and the metal posts (MP) can be formed using any metal such as copper or nickel, and, for example, can each be formed of a metal foil such as a copper foil and/or a metal film formed by plating or sputtering or the like. The conductor layers (102, 12, 112, 22), the via conductors (13, 23), the through-hole conductors 103, and the metal posts (MP) are each illustrated in FIG. 1 as having a single-layer structure, but can each have a multilayer structure that includes two or more metal layers. For example, the conductor layers 102 that are respectively formed on the surfaces of the insulating layer 101 can each have a three-layer structure including a metal foil (preferably, a copper foil), an electroless plating film (preferably, an electroless copper plating film), and an electrolytic plating film (preferably, an electrolytic copper plating film). Further, the conductor layers (12, 112, 22), the via conductors (13, 23), the through-hole conductors 103, and the metal posts (MP) can each have, for example, a two-layer structure including an electroless plating film and an electrolytic plating film.

The conductor layers (102, 12, 112, 22) of the wiring substrate 1 are each patterned to have predetermined conductor patterns. In particular, the first conductor layer 112 is formed to have patterns including multiple first conductor pads (P1) and multiple second conductor pads (P2). The metal posts (MP) are connected to the first conductor pads (P1) of the first conductor layer 112. That is, the first conductor pads (P1) of the first conductor layer 112 can be electrically connected to an external electronic component that can be mounted on the wiring substrate 1 via the metal posts (MP). Further, the multiple second conductor pads (P2) of the first conductor layer 112 are exposed in the openings (110b) and are connected to connection pads (IP) of the wiring structures (WS) positioned in the openings (110b). Specifically, as will be described later with reference to FIGS. 2A and 2B, the connection pads (IP) and the connection pads (OP) are electrically connected via wirings in the wiring structures (WS). Therefore, the second conductor pads (P2) can be electrically connected to an external electronic component via the connection pads (IP, OP).

The first conductor layer 112 in the wiring substrate 1 includes the multiple first conductor pads (P1) connected to an external electronic component via the metal posts (MP), and the multiple second conductor pads (P2) connected to an external electronic component via the wiring structures (WS). Upper surfaces of the connection pads (OP) of the wiring structures (WS) and upper surfaces of the metal posts (MP) form a component mounting surface of the wiring substrate 1 on which external electronic components can be connected. In other words, a distance of the upper surfaces of the wiring structures (WS) (the upper surfaces of the connection pads (OP)) from the upper surface of the first insulating layer 111 and a distance of the upper surfaces of the metal posts (MP) from the upper surface of the first insulating layer 111 are substantially equal to each other. The component mounting surface is indicated using a dashed line (IS) in FIG. 1.

The component mounting surface including the upper surfaces of the connection pads (OP) and the upper surfaces of the metal posts (MP) includes multiple component mounting regions, in the illustrated example, component mounting regions (EA1, EA2, EA3). The component mounting regions (EA1, EA2, EA3) respectively correspond to regions where electronic components (E1, E2, E3) are to be mounted.

In the illustrated example, multiple connection pads (OP) that form the upper surface of each of the wiring structures (WS) are positioned in two adjacent component mounting regions. Specifically, among six connection pads (OP) of the wiring structure (WS) on the left side of the two wiring structures (WS) illustrated (in a region (II) surrounded by a one-dot chain line), three connection pads (OP) are positioned in the component mounting region (EA1), and the other three connection pads (OP) are positioned in the component mounting region (EA2). Specifically, as will be described later with reference to FIGS. 2A and 2B, the connection pads (OP) positioned in different component mounting regions are electrically connected to each other by the wirings in the wiring structures (WS), and electronic components mounted in the component mounting regions can be electrically connected to each other.

Regarding positioning of the wiring structures (WS) and the metal posts (MP), from a point of view of suppressing influence of thermal expansion thereof on other structural elements (especially the metal posts (MP) and the first conductor pads (P1)) of the wiring substrate 1, the wiring structures (WS) are positioned in the openings such that side surfaces and upper surfaces thereof are entirely exposed. Further, the second insulating layer 110 has the multiple (two in the illustrated example) openings (110b) in the multiple component mounting regions (EA1, EA2, EA3), and at least some of the multiple first conductor pads (P1) on which the metal posts (MP) are connected are positioned in regions between the multiple openings (110b).

The metal posts (MP) and the connection pads (OP) can be electrically and mechanically connected to connection pads of external electronic components, for example, via conductive bonding members such as solder bumps (not illustrated in the drawings). By forming the connection pads (OP) in different component mounting regions, the wiring structures (WS) can perform the function of electrically connecting external electronic components (for example, the electronic components (E1, E2)) and can electrically connect the first conductor layer 112 (the second conductor pads (P2)) to the electronic components. The wiring structures (WS) can electrically connect electronic components to each other and can electrically connect a conductor layer on an inner side of the wiring structures (WS) of the wiring substrate 1 to the electronic components. Therefore, it is thought that a degree of freedom in routing wirings in the wiring substrate 1, that is, a degree of freedom in circuit design, is improved.

A surface of the wiring substrate 1 that is on the opposite side of the component mounting surface with respect to the core substrate 100 and is formed by the third insulating layer 210 and the conductor pads (22p) exposed from the openings (210a) can be a connection surface connected to an external element when the wiring substrate 1 itself is mounted on an external element such as an external wiring substrate (for example, a motherboard of any electrical device). The conductor pads (22p) can be connected to any substrate, electronic component, mechanism element, or the like.

Examples of the electronic components (E1, E2, E3) that can be mounted on the wiring substrate 1 include electronic components such as active components such as semiconductor integrated circuit devices and transistors. In the illustrated example, the electronic component (E1) can be, for example, an integrated circuit such as a logic chip incorporating a logic circuit, or a processing device such as an MPU (Micro Processor Unit), and the electronic components (E2, E3) can be, for example, a memory element such as an HBM (High Bandwidth Memory). That is, the wiring substrate 1 can have a form of an MCM (Multi Chip Module) in its use.

Figure 2A:
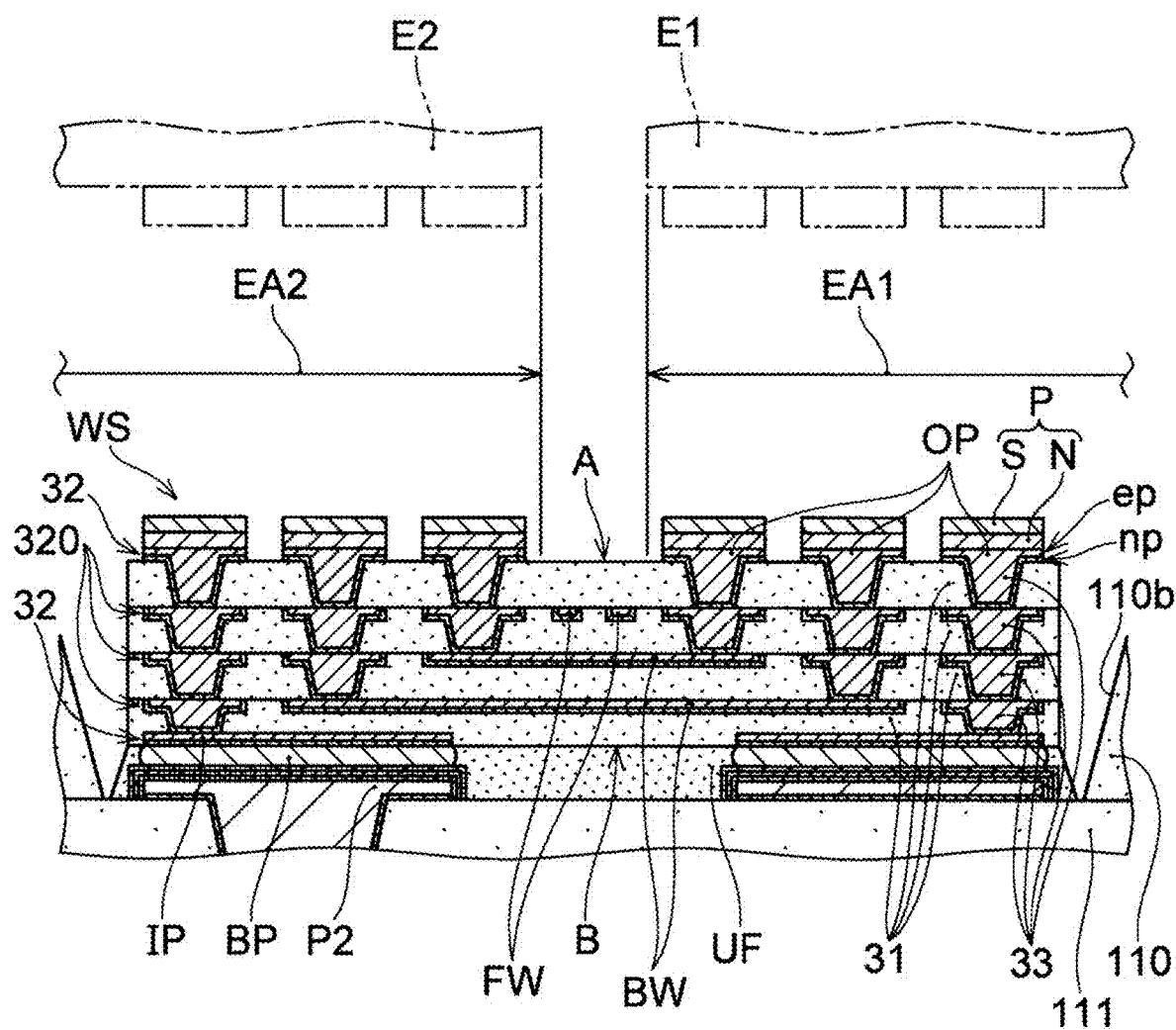
FIG. 2A is an enlarged view of the wiring structure in FIG. 1, which illustrates an example of a wiring substrate according to an embodiment of the present invention.
Figure 2B:
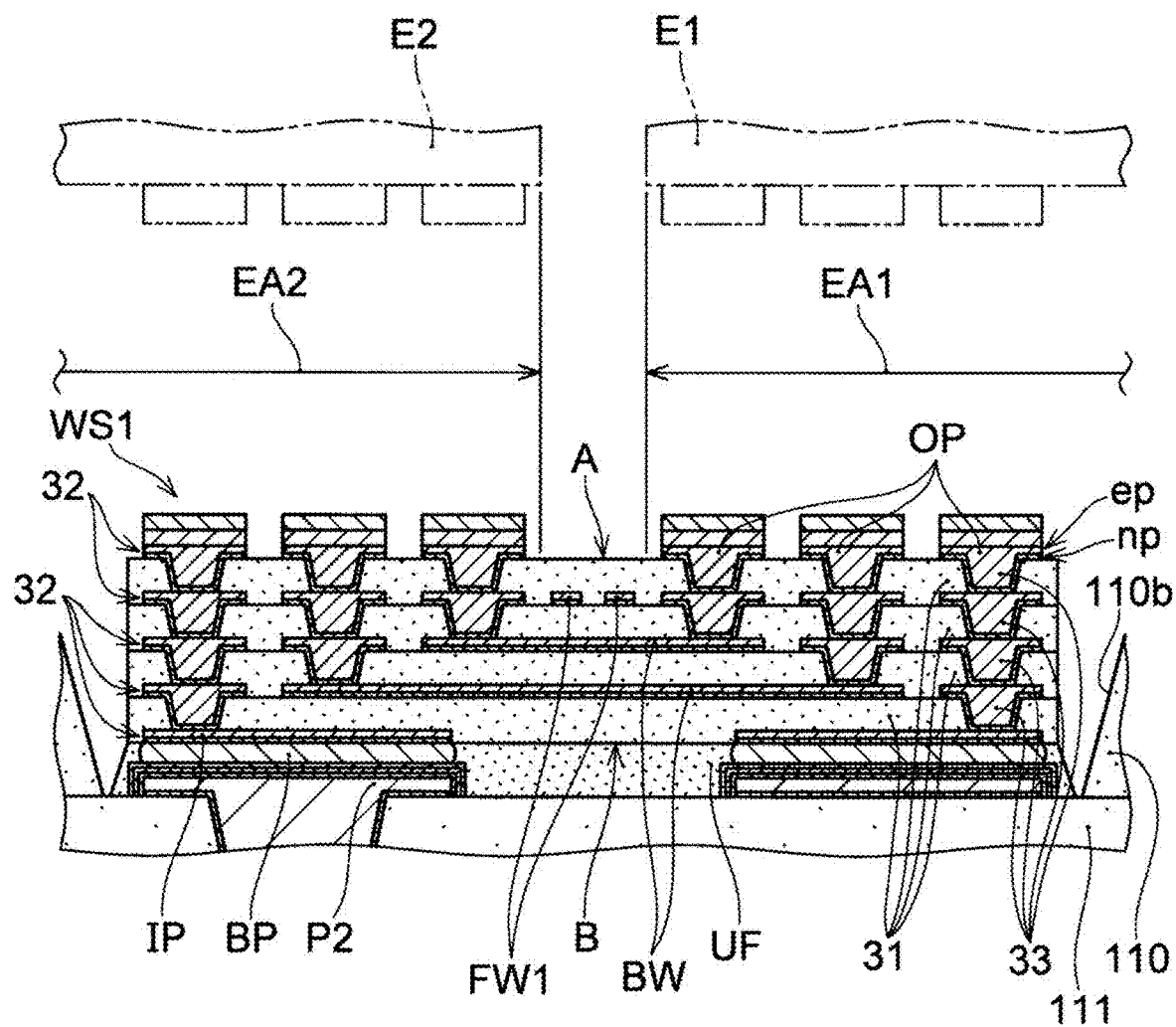
FIG. 2B is an enlarged view of a wiring structure in another example of a wiring substrate according to an embodiment of the present invention.

Next, with reference to FIGS. 2A and 2B, a structure of a wiring structure (WS) is described in detail. FIG. 2A is an enlarged view of the region (II) surrounded by the one-dot chain line in FIG. 1. A wiring structure (WS) positioned in an opening (110b) of the second insulating layer 110 includes alternately laminated resin insulating layers 31 and wiring layers (32, 320). Wiring layers (32, 320) facing each other across a resin insulating layer 31 are connected by via conductors 33.

The wiring structure (WS) has a first surface (A) and a second surface (B) on the opposite side with respect to the first surface (A). In the illustrated example, the second surface (B) is formed of a surface (lower surface) of the resin insulating layer 31 and a surface (lower surface) of the wiring layer 32. The wiring layer 32 forming the second surface (B) includes the connection pads (IP), and the connection pads (IP) are connected to the second conductor pads (P2) via bumps (BP), which are conductive bonding members (such as solder bumps). A protective film formed of, for example, three layers of Ni, Pd and Au is provided on the surfaces of the second conductor pads (P2), and the bumps (BP) can be bonded, for example, to the Au layer that forms an outermost surface of the protective layer. The first surface (A) is formed of a surface (upper surface) of the wiring layer 32 and a surface (upper surface) of the resin insulating layer 31 exposed from patterns of the wiring layer 32. The wiring layer 32 forming the first surface (A) has the connection pads (OP). As illustrated, for example, a plating layer (P) formed of two layers, a nickel layer (N) and a tin layer (S), can be formed on the surfaces of the connection pads (OP). The connection pads (OP) provided on the first surface (A) of the wiring structure (WS) are also referred to as the first surface side connection pads (OP), and the connection pads (IP) provided on the second surface (B) are also referred to as the second surface side connection pads (IP).

The resin insulating layers 31 can each be formed, for example, using an insulating resin such as an epoxy resin, or a phenol resin. The resin insulating layers 31 may contain one of a fluorine resin, a liquid crystal polymer (LCP), a fluoroethylene resin (PTFE), a polyester resin (PE), and a modified polyimide resin (MPI). Examples of conductors forming the wiring layers (32, 320) and the via conductors 33 include copper and nickel, and copper is preferably used. In the illustrated example, the wiring layers (32, 320) and the via conductors 33 each have a two-layer structure including a metal film layer (preferably an electroless copper plating film layer) (np) and a plating film layer (preferably an electrolytic copper plating film) (ep).

In a wiring structure (WS) in the wiring substrate of the embodiment, the second surface side connection pads (IP) and the first surface side connection pads (OP) are electrically connected via the conductors of the wiring structure (WS). Specifically, the second surface side connection pads (IP) and the first surface side connection pads (OP) are electrically connected via the wiring layers (32, 320) and the via conductors 33 of the wiring structure (WS). In the illustrated example, among the six first surface side connection pads (OP), the two first surface side connection pads (OP) positioned at both ends are respectively electrically connected to the second surface side connection pads (IP).

As described above with reference to FIG. 1, among the six first surface side connection pads (OP) illustrated, the three first surface side connection pads (OP) on the left side are formed in the component mounting region (EA2), and the three first surface side connection pads (OP) on the right side are formed in the component mounting region (EA1). In the use of the wiring substrate 1, the three first surface side connection pads (OP) on the left side can be connected to the external electronic component (E2), and the three first surface side connection pads (OP) on the right side can be connected to the external electronic component (E1). The first surface side connection pads (OP) positioned in the component mounting region (EA1) and the first surface side connection pads (OP) positioned in the component mounting region (EA2) are electrically connected via wirings (BW). That is, in the wiring substrate 1 of the embodiment, the upper surfaces of the first surface side connection pads (OP) form the first component mounting region and the second component mounting region, which are adjacent to each other, and some of the first surface side connection pads (OP) formed in first component mounting region and some of the first surface side connection pads (OP) formed in the second component mounting region are electrically connected to each other. Therefore, in the use of the wiring substrate 1, multiple external electronic components can be electrically connected to each other via the wiring structures (WS).

In positioning a wiring structure (WS) into an opening (110b), the wiring structure (WS) may be positioned by interposing an underfill insulating film (UF) between the second surface (B) and the upper surface of the first insulating layer 111. The underfill insulating film (UF) can be a thermosetting NCF (non-conductive film) that can contain an epoxy resin or a polyimide resin. By interposing the underfill insulating film (UF) between the wiring structure (WS) and the first insulating layer 111, connection reliability of the wiring structure (WS) to the conductor pads (P2) against a physical stress (a thermal stress or a physical external force) can be improved.

In the example illustrated in FIG. 2A, the wiring structure (WS) can have wiring layers having a form of embedded wirings. Specifically, a wiring layer 320 has a form of embedded wirings that are formed by conductors filling grooves formed in a resin insulating layer 31 on a lower side and are embedded in the resin insulating layer. A wiring layer 320 having a form of embedded wirings can have fine wirings (FW) that have relatively small pattern widths and inter-pattern distances. The fine wirings (FW) can have the smallest pattern widths and inter-pattern distances among the wirings of the wiring substrate 1.

In the illustrated example, among the multiple (five) wiring layers of the wiring structure (WS), three wiring layers 320 have the form of embedded wirings, and one of the three layers has the fine wirings (FW). However, the multiple wiring layers 320 can each include fine wirings (FW). The number of the wiring layers having the form of embedded wirings in the wiring structure (WS) is not limited.

The fine wirings (FW) of the wiring structure (WS) have pattern widths and inter-pattern distances smaller than those of the conductor layers (102, 12, 112, 22) in the wiring substrate 1 described above. Specifically, for example, the fine wirings (FW) have a minimum line width of 3.0 μm or less and a minimum inter-line distance of 3.0 μm or less. Since the wiring structure (WS) has the fine wirings (FW), it may be possible to provide wirings with more appropriate characteristic impedance for electrical signals that can be transmitted via the wirings in the wiring structure (WS). Further, it is thought that it may be possible to improve a wiring density in the wiring structure (WS) and to further improve a degree of freedom in wiring design. From a similar point of view, the wiring layers 320 having the fine wirings (FW) are preferably formed to have an aspect ratio of 1.8 or more and 6.0 or less, and further, all the wiring layers (32, 320) of the wiring structure (WS) are preferably formed to have an aspect ratio of 1.8 or more and 6.0 or less.

The fine wirings (FW) provided in the wiring structure (WS) can be wirings for high frequency signal transmission. Therefore, the resin insulating layers 31 in contact with the fine wirings (FW) preferably have excellent high frequency characteristics. When an insulating layer in contact with wirings has relatively high permittivity and dielectric loss tangent, a dielectric loss (transmission loss) of a high frequency signal transmitted via the wirings is relatively large. Therefore, the resin insulating layers 31 in contact with the fine wirings (FW) are preferably formed using a material having relatively small permittivity and dielectric loss tangent, and, at a frequency of 1 GHz, a relative permittivity is preferably 3.3 or less and a dielectric loss tangent is preferably 0.03 or less. Further, since all the resin insulating layers 31 of the wiring structure (WS) have excellent high frequency characteristics, the wiring structure (WS) can have an excellent signal transmission quality. Therefore, the resin insulating layers 31 of the wiring structure (WS) preferably have a relative permittivity of 3.3 or less and a dielectric loss tangent of 0.03 or less.

The wiring structures included in the wiring substrate of the embodiment are not limited to the mode of including wiring layers having the form of embedded wirings. An example in which a wiring structure does not have a wiring layer of embedded wirings is illustrated in FIG. 2B. In a wiring structure (WS1) illustrated in FIG. 2B, among wiring layers 32 of the wiring structure (WS1), the lower four wiring layers 32 respectively protrude into resin insulating layers 31 directly above, and the uppermost wiring layer 32 protrudes toward outside of the wiring structure (WS1). In the illustrated example, among the multiple wiring layers 32, one wiring layer 32 includes fine wirings (FW1). The fine wirings (FW1) can have similar dimensions as the fine wirings (FW) described above. Even in the illustrated wiring structure (WS1) that has no embedded wirings, the number of wiring layers provided with fine wirings (FW1) among the multiple wiring layers 32 is not limited.

Figure 3A:
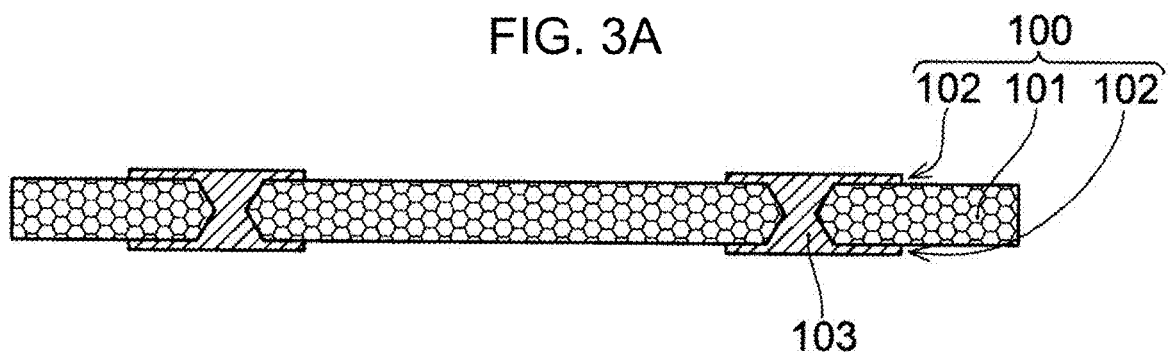
FIG. 3A is a cross-sectional view illustrating a method for manufacturing a wiring substrate according to an embodiment of the present invention.

Next, with reference to FIGS. 3A-3F, a method for manufacturing a wiring substrate is described using a case where the wiring substrate 1 illustrated in FIG. 1 is manufactured as an example. First, as illustrated in FIG. 3A, the core substrate 100 is prepared. In the preparation of the core substrate 100, for example, a double-sided copper-clad laminated plate including the core insulating layer 101 is prepared. Then, the core substrate 100 is prepared by using a subtractive method or the like to form the conductor layers 102 including predetermined conductor patterns on both sides of the insulating layer 101 and form the through-hole conductors 103 in the insulating layer 101.

Figure 3B:
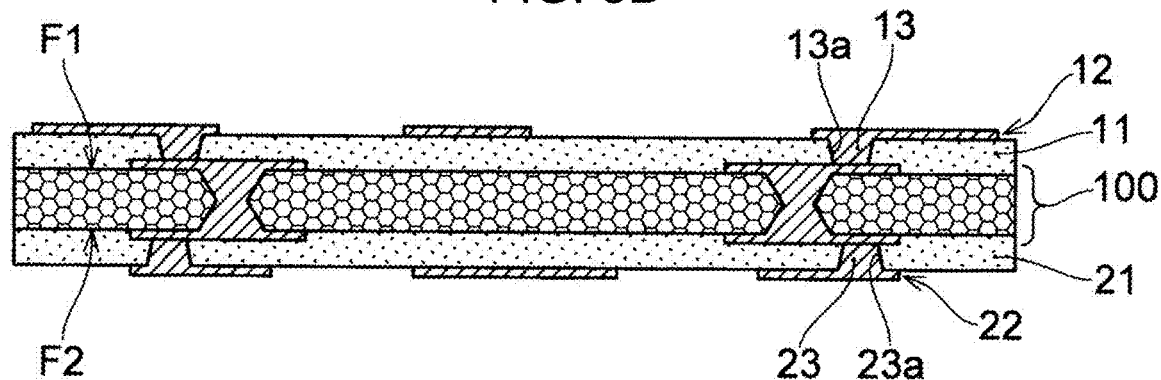
FIG. 3B is a cross-sectional view illustrating a method for manufacturing a wiring substrate according to an embodiment of the present invention.

Next, as illustrated in FIG. 3B, the insulating layer 11 is formed on the surface (F1) on one side of the core substrate 100, and the conductor layer 12 is laminated on the insulating layer 11. The insulating layer 21 is formed on the surface (F2) on the other side of the core substrate 100, and the conductor layer 22 is laminated on the insulating layer 21. For example, the insulating layers (11, 21) are each formed by thermocompression bonding a film-like insulating resin onto the core substrate 100. The conductor layers (12, 22) are formed using any method for forming conductor patterns, such as a semi-additive method, at the same time as the via conductors (13, 23) filling openings (13a, 23a) that can be formed in the insulating layers (11, 21), for example, using laser.

Figure 3C:
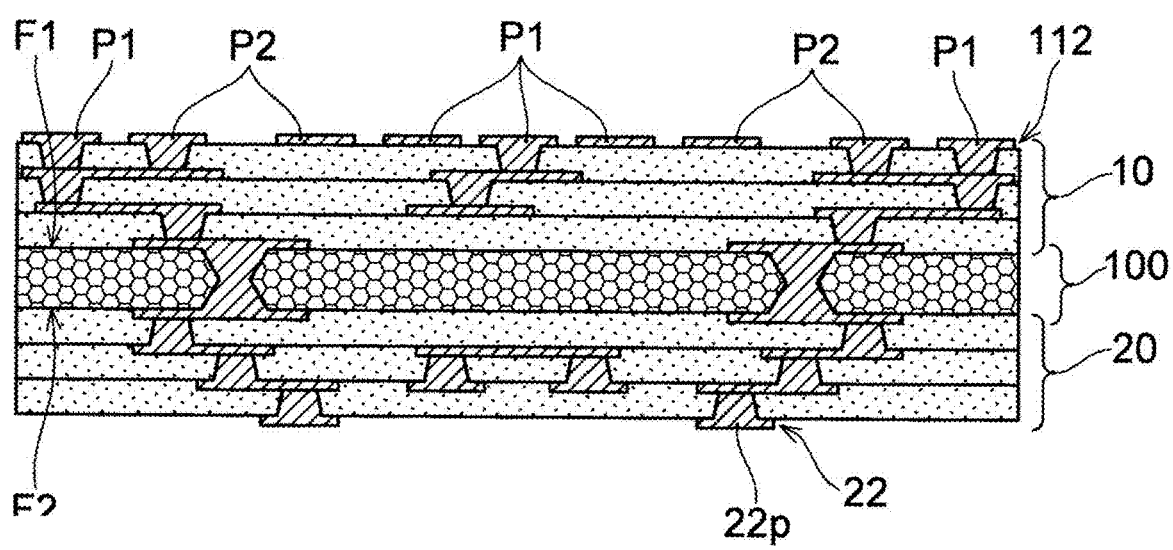
FIG. 3C is a cross-sectional view illustrating a method for manufacturing a wiring substrate according to an embodiment of the present invention.

Next, as illustrated in FIG. 3C, on the surface (F1) side on one side of the core substrate 100, lamination of an insulating layer and a conductor layer is repeated, and the first build-up part 10 is formed. On the surface (F2) side on the other side of the core substrate 100, lamination of an insulating layer and a conductor layer is repeated, and the second build-up part 20 is formed. The outermost conductor layer (first conductor layer 112) in the first build-up part 10 is formed to have patterns including the multiple conductor pads (the first conductor pads (P1) and the second conductor pads (P2)). The outermost conductor layer 22 in the second build-up part 20 is formed to have patterns including the conductor pads (22p). On the surfaces of the first conductor pads (P1), the second conductor pads (P2), and the conductor pads (22p), a protective layer including three layers, a nickel layer, a palladium layer, and a gold layer, can be formed using a plating method, for example, by electroless plating.

Figure 3D:
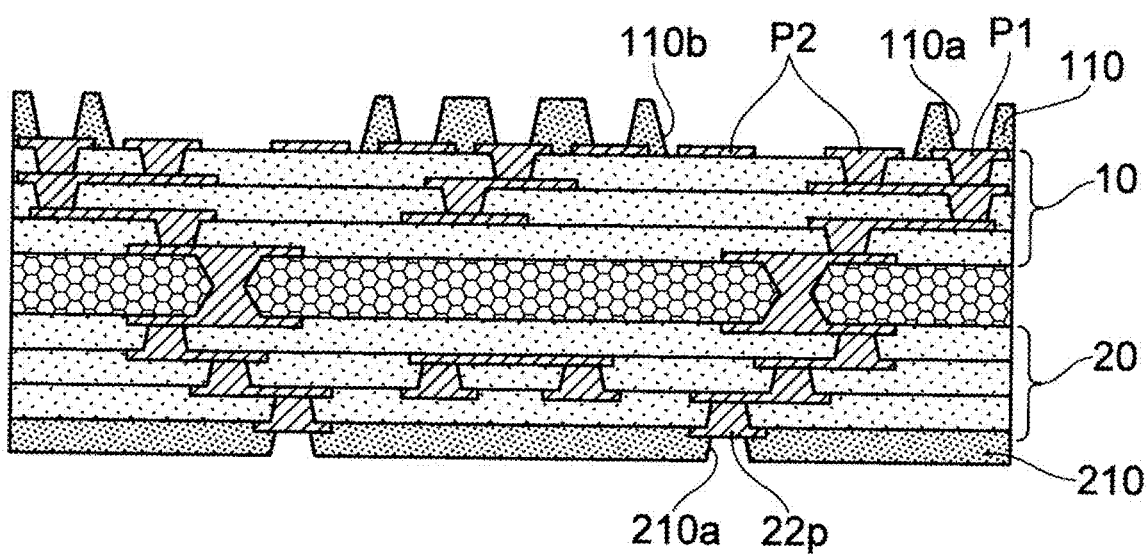
FIG. 3D is a cross-sectional view illustrating a method for manufacturing a wiring substrate according to an embodiment of the present invention.

Next, as illustrated in FIG. 3D, the second insulating layer 110 is formed on the first build-up part 10, and the third insulating layer 210 is formed on the second build-up part 20. In the second insulating layer 110, the openings (110a) exposing the first conductor pads (P1) and the openings (110b) exposing the second conductor pads (P2) are formed. In the third insulating layer 210, the openings (210a) exposing the conductor pads (22p) are formed. For example, the second and third insulating layers (110, 210) are each formed by forming a photosensitive epoxy resin film by spray coating, curtain coating, film pasting, or the like, and the openings (110a, 110b, 210a) are formed by exposure and development.

Figure 3E:
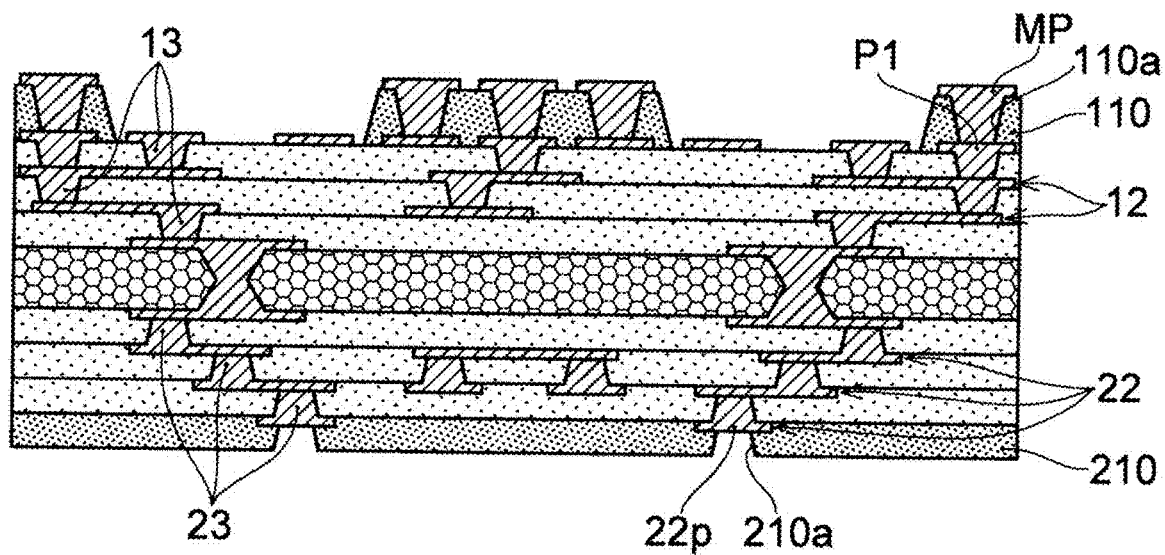
FIG. 3E is a cross-sectional view illustrating a method for manufacturing a wiring substrate according to an embodiment of the present invention.

Next, as illustrated in FIG. 3E, the openings (110a) are filled with conductors to form the metal posts (MP). Similar to the formation of the via conductors (13, 23) and the conductor layers (12, 22) described above, the metal posts (MP) can be formed, for example, using a semi-additive method. It is also possible that the formation of the metal posts (MP) is performed by only electroless plating on the first conductor pads (P1). In the process of forming the metal posts (MP), a surface formed of the upper surfaces of the third insulating layer 210 and the conductor pads (22p) can be appropriately protected by positioning a protective plate of PET or the like.

Figure 3F:
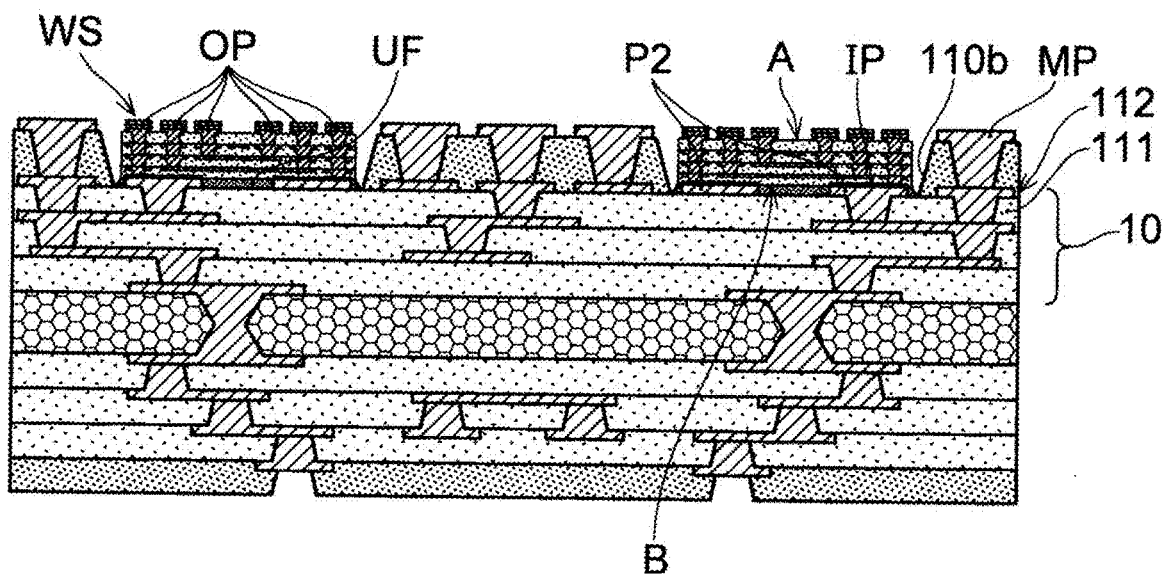
FIG. 3F is a cross-sectional view illustrating a method for manufacturing a wiring substrate according to an embodiment of the present invention.

Next, as illustrated in FIG. 3F, the wiring structures (WS) are respectively positioned in the openings (110b). Each wiring structure (WS) is positioned with the second surface (B) thereof facing the first build-up part 10 side and with the underfill insulating film (UF) interposed between the first insulating layer 111 and the second surface (B). The second surface side connection pads (IP) included in the second surface (B) are electrically and mechanically connected to the second conductor pads (P2), which form bottoms of the openings (110b), for example, via conductive connection members, which are solder bumps (not illustrated in the drawings). Each wiring structure (WS) is positioned such that a distance of the upper surfaces of the first surface side connection pads (OP) from the upper surface of the first insulating layer 111 is substantially equal to a distance of the upper surfaces of the metal posts (MP) from the upper surface of the first insulating layer 111.

Figure 4A:
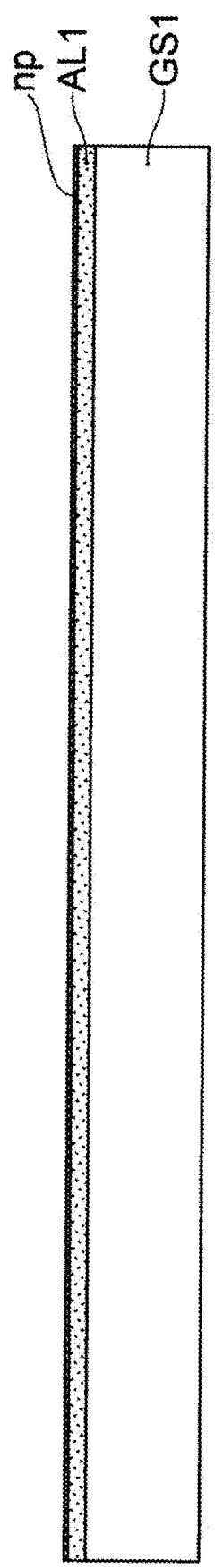
FIG. 4A is a cross-sectional view illustrating a method for manufacturing a wiring substrate according to an embodiment of the present invention.

Next, manufacture of the wiring structure (WS) illustrated in FIG. 2A and positioning of the wiring structure (WS) into an opening (110b) are described with reference to FIGS. 4A-4I. In the manufacture of the wiring structure (WS), first, as illustrated in FIG. 4A, a first support substrate (GS1) having good surface flatness, such as a glass substrate, is prepared. On a surface on one side of the first support substrate (GS1), a metal film layer (np) is formed via an adhesive layer (AL1) containing an azobenzene polymer adhesive that can be detached, for example, by irradiation with light. The metal film layer (np) is, for example, a metal film (preferably a copper film) formed by electroless plating or sputtering or the like. It is also possible that the metal film layer (np) is formed of a relatively thin metal foil. In the description of the manufacture of the wiring structure, a side closer to the first support substrate (GS1) is referred to as "lower" or "lower side," and a side farther from the first support substrate (GS1) is referred to as "upper" or "upper side." Therefore, of each of the elements of the wiring structure, a surface facing the first support substrate (GS1) is referred to as a "lower surface," and a surface facing the opposite side with respect to the first support substrate (GS1) is also referred to as an "upper surface."

Figure 4B:
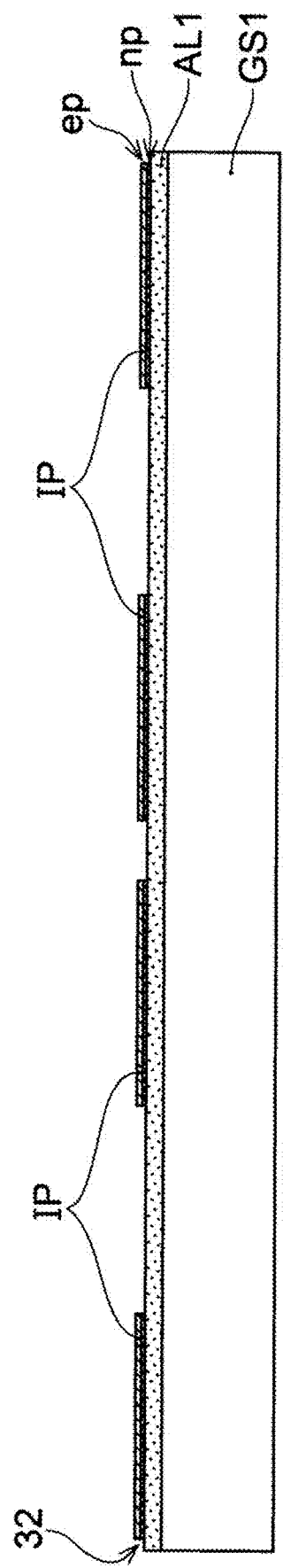
FIG. 4B is a cross-sectional view illustrating a method for manufacturing a wiring substrate according to an embodiment of the present invention.

Next, as illustrated in FIG. 4B, a wiring layer 32 that includes the metal film layer (np) and an electrolytic plating film layer (ep) and has four connection pads (IP) is formed on the support substrate (GS) via the adhesive layer (AL1). In the illustrated example, the wiring layer 32 has four connection pads (IP) on one first support substrate (GS1). That is, in the method for manufacturing a wiring structure described with reference to FIGS. 4A-4I, an example is described in which two wiring structures (WS) are formed on one first support substrate (GS1).

In forming the wiring layer 32, for example, a plating resist is formed on the metal film layer (np), and openings according to formation regions of patterns of the connection pads (IP) are formed in the plating resist, for example, by photolithography. Next, the electrolytic plating film layer (ep) is formed in the openings by electrolytic plating using the metal film layer (np) as a seed layer. After the formation of the electrolytic plating film layer (ep), the plating resist is removed, and the metal film layer (np) exposed by the removal of the plating resist is etched, and the state illustrated in FIG. 4B is formed.

Figure 4C:
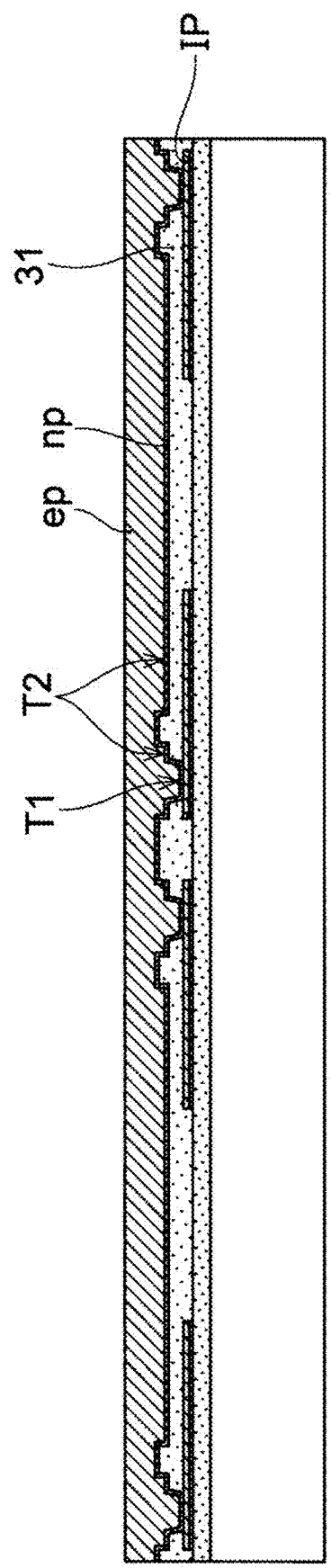
FIG. 4C is a cross-sectional view illustrating a method for manufacturing a wiring substrate according to an embodiment of the present invention.

Next, as illustrated in FIG. 4C, a resin insulating layer 31 covering the wiring layer 32 that includes the second surface side connection pads (IP) is laminated. As the resin insulating layer 31, for example, an insulating resin such as an epoxy resin or a phenol resin can be used. A fluorine resin, a liquid crystal polymer (LCP), a fluoroethylene resin (PTFE), a polyester resin (PE), or a modified polyimide resin (MPI) also may be used. The insulating resin used for the resin insulating layer 31 preferably has relatively small relative permittivity and dielectric loss tangent, and a material having a relative permittivity of 3.3 or less and a dielectric loss tangent of 0.03 or less at a frequency of 1 GHz can be preferably used.

Grooves (T1, T2) are formed in the laminated resin insulating layer 31. The grooves (T1) are formed at positions at which the via conductors are to be formed, and penetrate the resin insulating layer 31 to expose the wiring layer 32 immediately below the resin insulating layer 31. The grooves (T2) are formed at positions corresponding to the patterns of the wiring layer 320 (see FIG. 2A) having the form of embedded wirings. In forming the grooves (T1, T2), for example, laser processing using excimer laser is used. Next, a metal film layer (np) is formed so as to cover the entire upper surfaces of the resin insulating layer 31 and the wiring layer 32 exposed from the grooves (T1), and an electrolytic plating film layer (ep) is formed by electrolytic plating using the metal film layer (np) as a seed layer. The state illustrated in FIG. 4C is formed.

Next, as illustrated in FIG. 4D, the electrolytic plating film layer (ep) and the metal film layer (np) are partially removed by polishing, and, on the exposed upper surfaces of the resin insulating layer 31 and the wiring layer 320, a resin insulating layer 31 is further laminated, and formation of a wiring layer 320 is repeated. The polishing of the electrolytic plating film layer (ep) and the metal film layer (np) can be performed, for example, by chemical mechanical polishing (CMP).

Figure 4E:
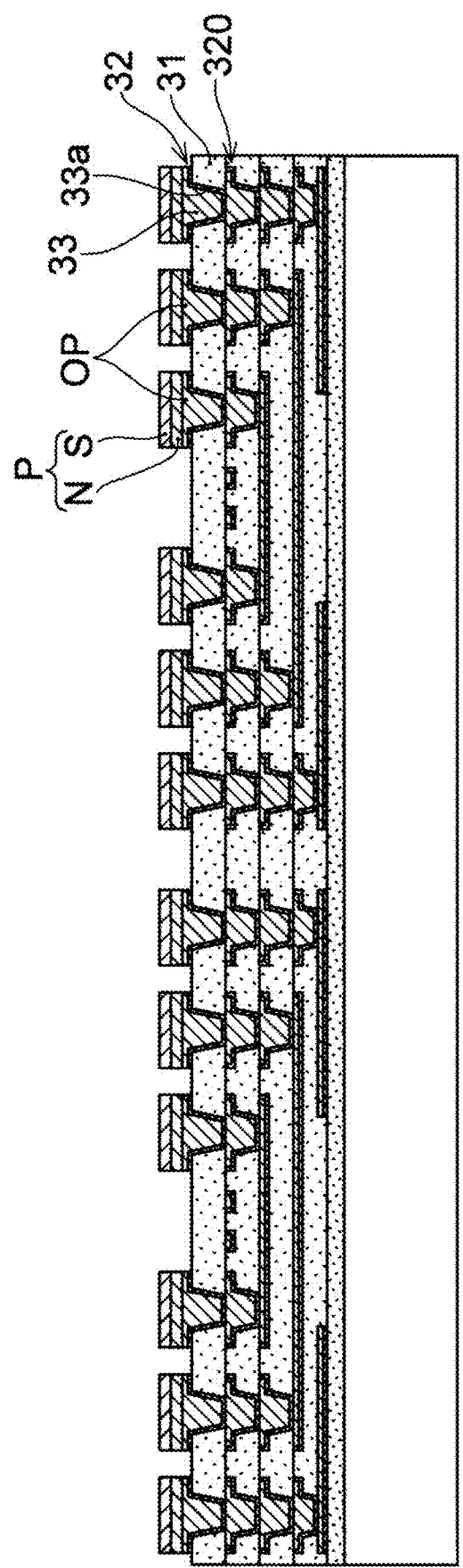
FIG. 4E is a cross-sectional view illustrating a method for manufacturing a wiring substrate according to an embodiment of the present invention.

Next, as illustrated in FIG. 4E, on an upper side of the conductor layer 320, a resin insulating layer 31, which is the uppermost resin insulating layer of the wiring structure (WS), and a wiring layer 32, which is the uppermost wiring layer, are formed. Openings (33a) are formed in the resin insulating layer 31, and the wiring layer 32 is formed together with the via conductors 33, for example using a semi-additive method. The uppermost wiring layer 32 is formed to have patterns including the multiple connection pads (OP). On the upper surfaces of the connection pads (OP), for example, a plating layer (P) including a nickel layer (N) and a tin layer (S) is formed. Formation of a laminated structure for the wiring structure (WS) is completed.

Figure 4F:
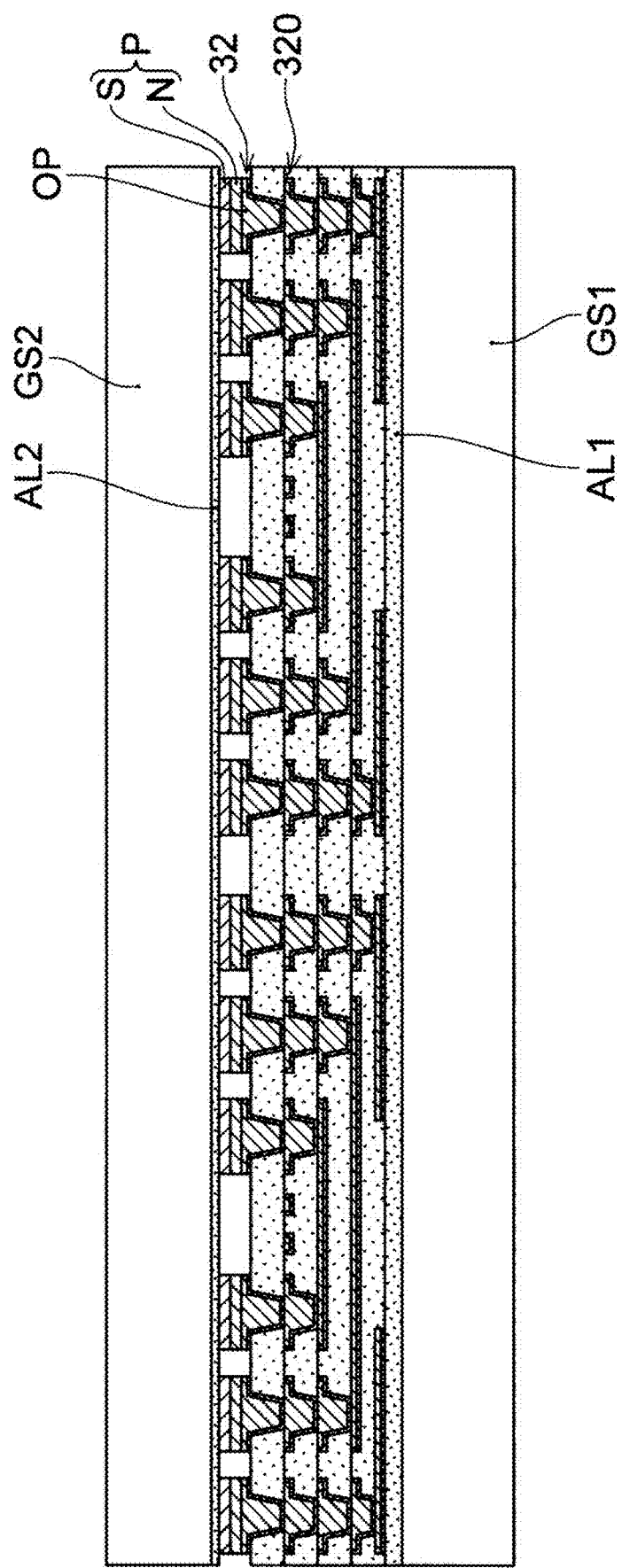
FIG. 4F is a cross-sectional view illustrating a method for manufacturing a wiring substrate according to an embodiment of the present invention.

Next, as illustrated in FIG. 4F, after the formation of the laminated structure for the wiring structure (WS) is completed, a second support substrate (GS2) is attached to the upper surface of the plating layer (P) of the uppermost wiring layer 32. The second support substrate (GS2) is formed of, for example, a glass plate, and is attached with a surface on one side of the second support substrate (GS2) facing the wiring layer 32 side and with an adhesive layer (AL2), which is formed of a material, for example, same as that of the adhesive layer (AL1), interposed between the surface on one side of the second support substrate (GS2) and the upper surface of the wiring layer 32.

Figure 4G:
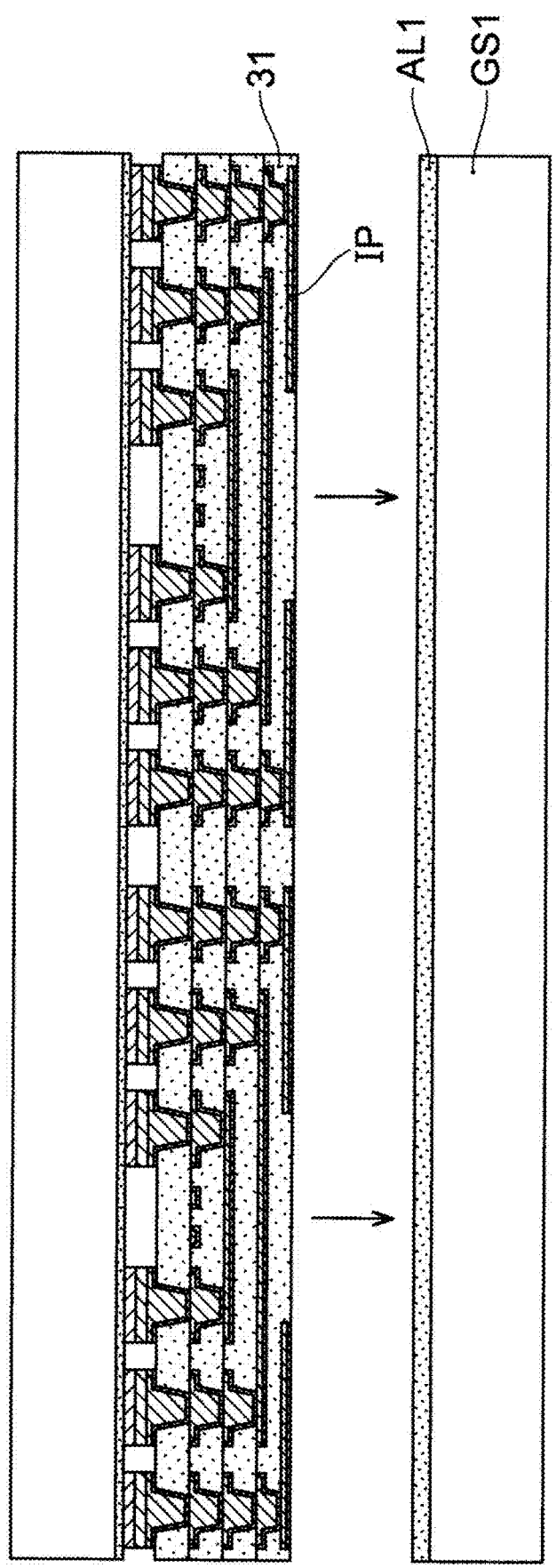
FIG. 4G is a cross-sectional view illustrating a method for manufacturing a wiring substrate according to an embodiment of the present invention.

Next, as illustrated in FIG. 4G, the first support substrate (GS1) is removed. The lower surfaces of the connection pads (IP) and the lower surface of the resin insulating layer 31 are exposed. In removing the first support substrate (GS1), the adhesive layer (AL1) is softened, for example, by irradiation with laser, and then the first support substrate (GS1) is peeled off from the connection pads (IP) and the resin insulating layer 31. The adhesive layer (AL1) that can remain on the second surface side can be removed by washing.

Figure 4H:
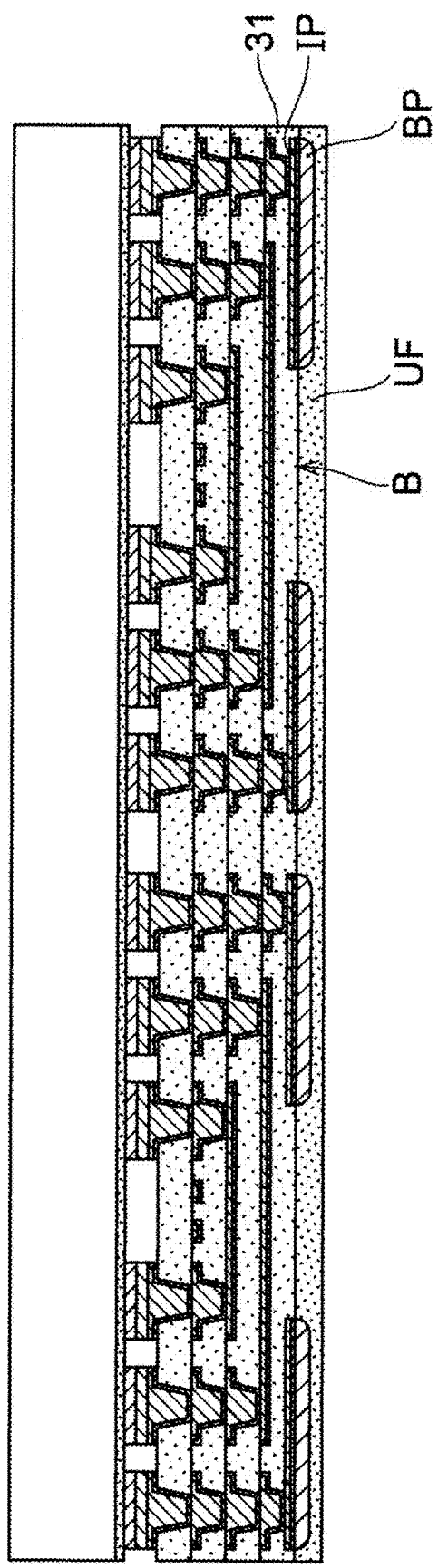
FIG. 4H is a cross-sectional view illustrating a method for manufacturing a wiring substrate according to an embodiment of the present invention.

Next, as illustrated in FIG. 4H, bumps (BP), which are bonding members formed of solder, for example, are formed on the exposed surfaces (lower surfaces) of the connection pads (IP). The bumps (BP) are formed on the connection pads (IP), for example, via a diffusion preventing metal film (not illustrated in the drawings) formed on the surfaces of the connection pads (IP). After the bumps (BP) are formed on the connection pads (IP), an underfill insulating film (UF) is provided so as to cover the lower surfaces of the bumps (BP) and the resin insulating layer 31. The underfill insulating film (UF) is attached, for example, to the lower surfaces of the bumps (BP) and the resin insulating layer 31 under vacuum.

Figure 4I:
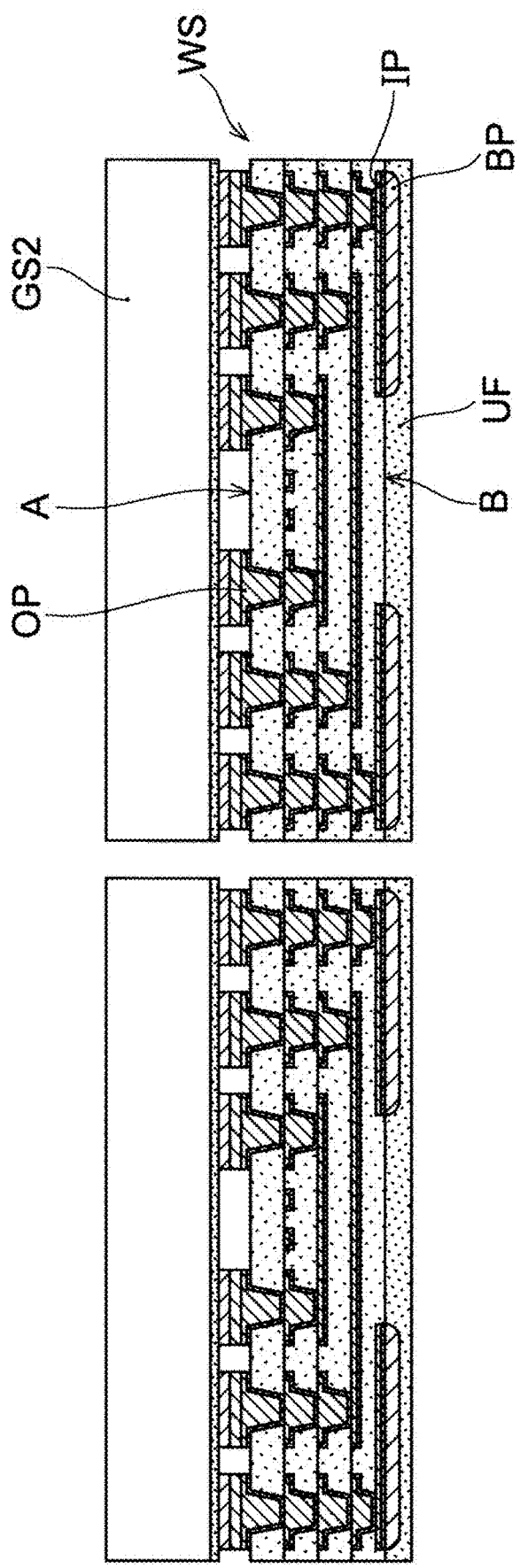
FIG. 4I is a cross-sectional view illustrating a method for manufacturing a wiring substrate according to an embodiment of the present invention.

Next, as illustrated in FIG. 4I, the wiring structures (WS) are separated into pieces together with the second support substrate (GS2). For example, the second support substrate (GS2), the wiring structures (WS), and the underfill insulating film (UF) are cut along predetermined dicing lines by a dicing saw and are separated into pieces. A wiring structure (WS) in a state with the second support substrate (GS2) positioned on the first surface (A) and being covered by the underfill insulating film (UF) is formed.

As illustrated in FIG. 3F, the singulated wiring structures (WS) are positioned in the openings (110b). In positioning the wiring structures (WS) into the openings (110b), with the second support substrate (GS2) provided, the bumps (BP) and the second conductor pads (P2) are aligned so that their positions correspond. In a state in which it is heated to a temperature (for example, about 60-150° C.) at which the underfill insulating film (UF) is flowable but noticeable hardening is not started, a pressure is applied downward until the bumps (BP) are in contact with the second conductor pads (P2). After that, it is heated to a melting temperature of the bumps (BP), and bonding between the bumps (BP) and the second conductor pads (P2) is completed. After the bonding is completed, the second support substrate (GS2) is removed in the same way as the peeling of the first support substrate (GS1) described with reference to FIG. 4G. The positioning of the wiring structures (WS) into the openings (110b) is completed.

When the wiring structure (WS1) illustrated in FIG. 2B is formed, instead of the wiring layer 320 having the form of embedded wirings described with reference to FIGS. 4C and 4D, a wiring layer 32 is formed in the same way as the formation of the resin insulating layer 31 and the conductor layer 32 described above. In the formation of the wiring layer 32 on the resin insulating layer 31, in forming openings in a plating resist that is formed on the upper side of the resin insulating layer 31 according to patterns to be included in the wiring layer 32, excimer laser having a relatively short wavelength and excellent straightness in relatively fine processing of an insulating layer can be preferably used.

The wiring substrate of the embodiment is not limited to those having the structures illustrated in the drawings and those having the structures, shapes, and materials exemplified herein. For example, the wiring structure can have any number of conductor layers and any number of insulating layers. The first build-up part and the second build-up part each can include any number of insulating layers and any number of conductor layers. The number of insulating layers and conductor layers of the first build-up part and the number of insulating layers and conductor layers of the second build-up part formed on both sides of the core substrate may be different from each other. Further, the wiring substrate is not limited to the mode of having a core substrate, and the wiring substrate of the embodiment only needs to have at least a structure on the upper side of the first insulating layer. In the description of the embodiment, an example is described in which the connection pads of one wiring structure are formed over two component mounting regions. However, it is also possible to realize a structure in which connection pads of one wiring structure are formed over three or more component mounting regions and electronic components that can be mounted in the component mounting regions can be electrically connected to each other.

Japanese Patent Application Laid-Open Publication No. 2014-82334 describes a wiring board in which a wiring structure is formed in an opening provided in a solder resist layer. The wiring structure has conductor pads only on one side (upper surface) thereof. The wiring structure is formed with a surface (lower surface) thereof on which no conductor pads are formed facing an interlayer insulating layer exposed at a bottom surface of the opening. A semiconductor component such as an MPU or a DRAM is mounted on the conductor pads on the upper surface of the wiring structure.

In the wiring board described in Japanese Patent Application Laid-Open Publication No. 2014-82334, the lower surface of the wiring structure is not electrically connected to a conductor layer included in the wiring board. That is, there is no wiring that electrically connects from the lower surface of the wiring structure via the upper surface to the semiconductor component. It is thought that a degree of freedom in routing wiring circuits in the wiring board is low.

A wiring substrate according to an embodiment of the present invention includes: a first insulating layer; a first conductor layer that is formed on the first insulating layer and includes multiple first conductor pads and multiple second conductor pads; a second insulating layer that is formed on the first conductor layer and has at least one opening exposing the multiple second conductor pads; and a wiring structure that includes a resin insulating layer and a wiring layer and is positioned in the at least one opening. The wiring structure has a first surface, on which multiple first surface side connection pads are provided, and a second surface, which is on the opposite side with respect to the first surface and on which second surface side connection pads are provided. The multiple first surface side connection pads form a component mounting surface having multiple component mounting regions including a first component mounting region and a second component mounting region, which are adjacent to each other. Some of the multiple first surface side connection pads formed in the first component mounting region and some of the multiple first surface side connection pads formed in the second component mounting region are electrically connected to each other. The second surface side connection pads and the second conductor pads are electrically connected. The second surface side connection pads and the first surface side connection pads are electrically connected via conductors of the wiring structure.

According to an embodiment of the present invention, it is possible to provide a wiring substrate with a high degree of freedom in designing wirings between electronic components mounted via wiring structures.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
   a first insulating layer;
   a conductor layer formed on the first insulating layer and including a plurality of first conductor pads and a plurality of second conductor pads;
   a second insulating layer formed on the conductor layer and having at least one opening exposing the plurality of second conductor pads; and
   a wiring structure comprising a resin insulating layer and a wiring layer and formed such that the wiring structure is formed in the at least one opening of the second insulating layer,
   wherein the wiring structure has a plurality of first surface side connection pads formed on a first surface, a plurality of second surface side connection pads formed on a second surface on an opposite side with respect to the first surface and electrically connected to the second conductor pads of the conductor layer, and a plurality of conductors that electrically connect the first surface side connection pads and the second surface side connection pads, the wiring structure is formed such that the plurality of first surface side connection pads forms a component mounting surface having a plurality of component mounting regions including a first component mounting region and a second component mounting region adjacent to the first component mounting region, and the plurality of first surface side connection pads in the wiring structure includes a group of first surface side connection pads in the first component mounting region and a group of first surface side connection pads in the second component mounting region electrically connected to the group of first surface side connection pads in the first component mounting region.

2. The wiring substrate according to claim 1, wherein the wiring structure is formed such that the wiring layer includes a plurality of wirings having a smallest line width and a smallest linter-line distance in the wiring substrate.

3. The wiring substrate according to claim 2, wherein the second insulating layer is formed such that the at least one opening comprises a plurality of openings, and the conductor layer is formed such that the plurality of first conductor pads includes a group of first conductor pads positioned in a region between two adjacent openings of the plurality of openings.

4. The wiring substrate according to claim 2, further comprising:
   a plurality of metal posts penetrating through the second insulating layer such that the metal posts are connected to the first conductor pads.

5. The wiring substrate according to claim 4, wherein the plurality of metal posts is formed such that upper surfaces of the metal posts and upper surfaces of the first surface side connection pads form the component mounting surface of the wiring structure.

6. The wiring substrate according to claim 5, wherein the plurality of metal posts is formed such that a distance from an upper surface of the first insulating layer to the upper surfaces of the metal posts is substantially equal to a distance from the upper surface of the first insulating layer to the upper surfaces of the first surface side connection pads.

7. The wiring substrate according to claim 2, wherein the wiring structure is formed such that the plurality of wirings comprises a plurality of conductors filling a plurality of grooves formed in the resin insulating layer.

8. The wiring substrate according to claim 2, wherein the wiring structure is positioned in the at least one opening such that a side surface and an upper surface of the wiring structure are entirely exposed.

9. The wiring substrate according to claim 2, wherein the wiring structure includes the plurality of wirings having a minimum line width of 3.0 µm or less, a minimum inter-line distance of 3.0 µm or less, and an aspect ratio in a range of 1.8 to 6.0.

10. The wiring substrate according to claim 2, wherein the wiring structure is formed such that the resin insulating layer has a dielectric loss tangent of 0.03 or less and a relative permittivity of 3.3 or less at a frequency of 1 GHz.

11. The wiring substrate according to claim 1, wherein the second insulating layer is formed such that the at least one opening comprises a plurality of openings, and the conductor layer is formed such that the plurality of first conductor pads includes a group of first conductor pads positioned in a region between two adjacent openings of the plurality of openings.

12. The wiring substrate according to claim 1, further comprising:

a plurality of metal posts penetrating through the second insulating layer such that the metal posts are connected to the first conductor pads.

13. The wiring substrate according to claim 12, wherein the plurality of metal posts is formed such that upper surfaces of the metal posts and upper surfaces of the first surface side connection pads form the component mounting surface of the wiring structure.

14. The wiring substrate according to claim 13, wherein the plurality of metal posts is formed such that a distance from an upper surface of the first insulating layer to the upper surfaces of the metal posts is substantially equal to a distance from the upper surface of the first insulating layer to the upper surfaces of the first surface side connection pads.

15. The wiring substrate according to claim 12, wherein the wiring structure is formed such that the wiring layer comprises a plurality of conductors filling a plurality of grooves formed in the resin insulating layer.

16. The wiring substrate according to claim 12, wherein the wiring structure is positioned in the at least one opening such that a side surface and an upper surface of the wiring structure are entirely exposed.

17. The wiring substrate according to claim 1, wherein the wiring structure is formed such that the wiring layer comprises a plurality of conductors filling a plurality of grooves formed in the resin insulating layer.

18. The wiring substrate according to claim 1, wherein the wiring structure is positioned in the at least one opening such that a side surface and an upper surface of the wiring structure are entirely exposed.

19. The wiring substrate according to claim 1, wherein the wiring structure includes a plurality of wirings having a minimum line width of 3.0 μm or less, a minimum inter-line distance of 3.0 μm or less, and an aspect ratio in a range of 1.8 to 6.0.

20. The wiring substrate according to claim 1, wherein the wiring structure is formed such that the resin insulating layer has a dielectric loss tangent of 0.03 or less and a relative permittivity of 3.3 or less at a frequency of 1 GHz.

* * * * *